US012563863B2

(12) United States Patent
Sandoval

(10) Patent No.: US 12,563,863 B2
(45) Date of Patent: Feb. 24, 2026

(54) BACK-SIDE SOLAR CELL SOLDERING

(71) Applicant: Maxeon Solar Pte. Ltd., Marina Bay Financial Centre (SG)

(72) Inventor: Vergil Rodriguez Sandoval, Calamba City (PH)

(73) Assignee: Maxeon Solar Pte. Ltd., Singapore (SG)

(*) Notice: Subject to any disclaimer, the term of this patent is extended or adjusted under 35 U.S.C. 154(b) by 561 days.

(21) Appl. No.: 18/075,240

(22) Filed: Dec. 5, 2022

(65) Prior Publication Data

US 2024/0186427 A1 Jun. 6, 2024

(51) Int. Cl.
H10F 71/00 (2025.01)
H10F 77/00 (2025.01)
(52) U.S. Cl.
CPC ........... H10F 77/939 (2025.01); H10F 71/00 (2025.01); H10F 77/937 (2025.01)
(58) Field of Classification Search
CPC ...... H10F 77/939; H10F 77/937; H10F 71/00; H10F 71/1375; H10F 19/902
See application file for complete search history.

(56) References Cited

U.S. PATENT DOCUMENTS

| 8,822,810 B2 * | 9/2014 | Luch | H10F 77/223 |
| | | | 136/244 |
| 8,884,155 B2 * | 11/2014 | Luch | H10F 19/35 |
| | | | 136/244 |
| 8,927,315 B1 * | 1/2015 | Sheats | H10F 19/00 |
| | | | 438/57 |
| 9,105,776 B2 * | 8/2015 | Lee | H10F 77/14 |
| 9,236,512 B2 * | 1/2016 | Luch | H10F 19/31 |
| 2010/0275976 A1 * | 11/2010 | Rubin | H10F 77/935 |
| | | | 136/251 |
| 2022/0084578 A1 * | 3/2022 | Li | G11C 11/4093 |

FOREIGN PATENT DOCUMENTS

| KR | 20210107830 A | * | 9/2021 | H10F 71/00 |

* cited by examiner

*Primary Examiner* — Bayan Salone
(74) *Attorney, Agent, or Firm* — Schwabe, Williamson & Wyatt, P.C.

(57) ABSTRACT

Methods of soldering wire, such as traces or ribbon, onto single or multi-busbar solar cells. Devices constructed with such methods may also be covered. Methods may include providing a wire, such as a trace or ribbon, tack soldering the wire at one or more locations to a workpiece, such as solar cell component, and then passing the combined tacked wire and solar cell component through a heating zone where heat is applied to the backside of the solar cell component such that solder in contact with the wire melts and solders the wire to the solar cell component.

7 Claims, 7 Drawing Sheets

Roller

Heated Roller

1010

Positioning a first PV cell and a wire into a work area, the PV cell having a bottom and a pad, the pad having been previously tack soldered to the wire

1020

Applying a force to push the wire and pad towards each other

1030

Applying heat to the bottom of the PV cell, the heat sufficient to melt solder adjacent the wire and when the solder cools, to have soldered the wire to the pad

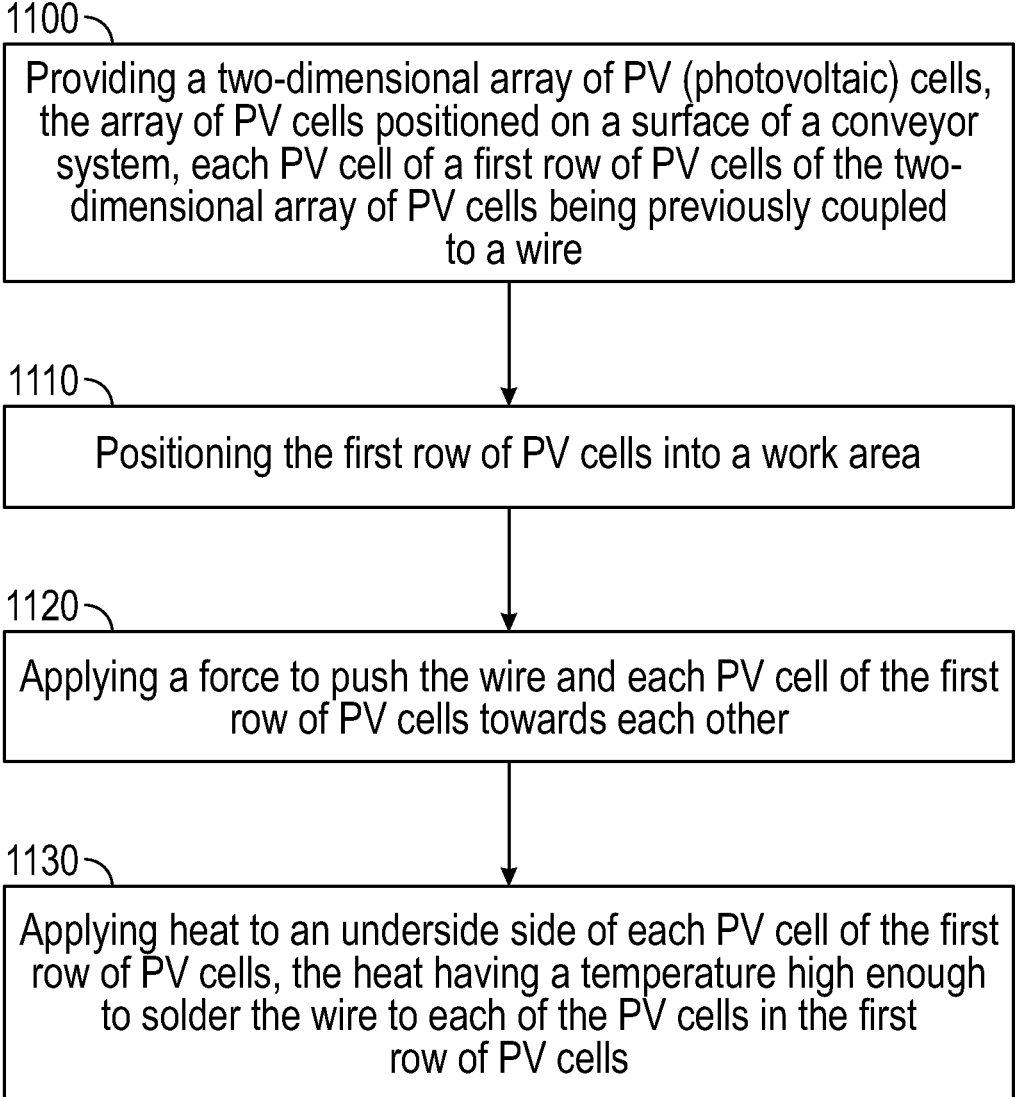

1100 —
Providing a two-dimensional array of PV (photovoltaic) cells, the array of PV cells positioned on a surface of a conveyor system, each PV cell of a first row of PV cells of the two-dimensional array of PV cells being previously coupled to a wire 1110 —
Positioning the first row of PV cells into a work area 1120 —
Applying a force to push the wire and each PV cell of the first row of PV cells towards each other 1130 —
Applying heat to an underside side of each PV cell of the first row of PV cells, the heat having a temperature high enough to solder the wire to each of the PV cells in the first row of PV cells

FIG. 11

BACK-SIDE SOLAR CELL SOLDERING

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

PV panels and PV modules, which may be considered PV panels with power management components such as an inverter circuit or clipping circuit, may each themselves comprise various constituent components. These constituent components may include laminated layers as well as PV cells and electrical connecting wires both within the PV cells and between PV cells. The assembly of constituent components to each other may involve numerous steps and sequences bringing the components together and mechanically and/or electrically coupling them to one or more other components.

BRIEF DESCRIPTION OF THE DRAWINGS

FIG. 11 shows a method of assembling a two-dimensional array of PV (photovoltaic) cells as may be employed in embodiments.

DETAILED DESCRIPTION

Figure 1:
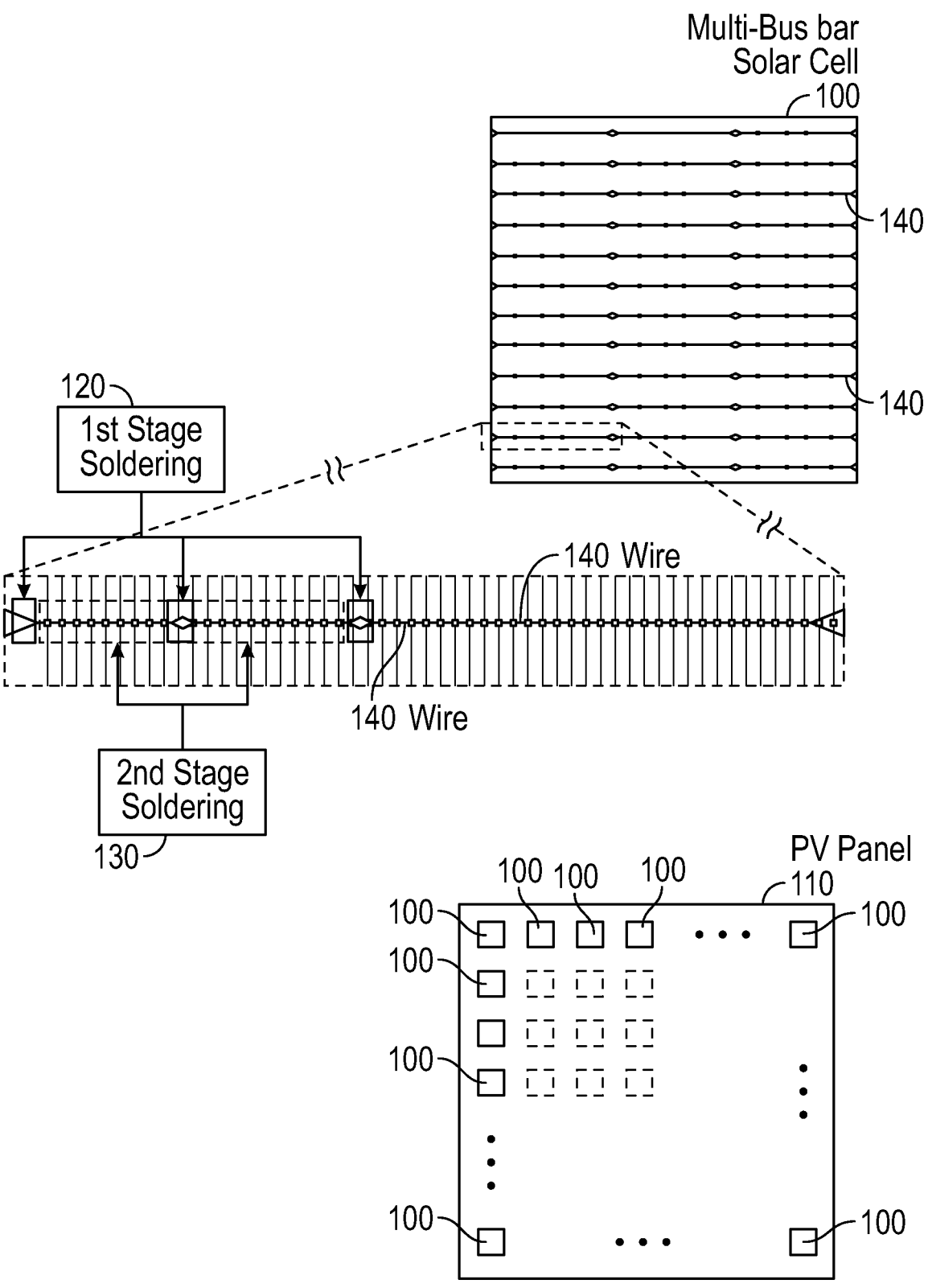
FIG. 1 illustrates, as may be employed in embodiments, a top down view of a multi-busbar (MBB) solar cell and an enlarged portion of the MBB solar cell with identified tack soldering and identified back-side soldering as well as a PV panel having multiple MBB solar cells.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112(f) for that unit/component.

"First," "Second," etc. As used herein, these terms are used as labels for nouns that they precede, and do not imply any type of ordering (e.g., spatial, temporal, logical, etc.). For example, reference to a "first" solar cell to be soldered to a wire does not necessarily imply that this solar cell is the first solar cell in a sequence; instead, the term "first" is used to differentiate this solar cell from another solar cell (e.g., a "second" solar cell).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

Figure 8:
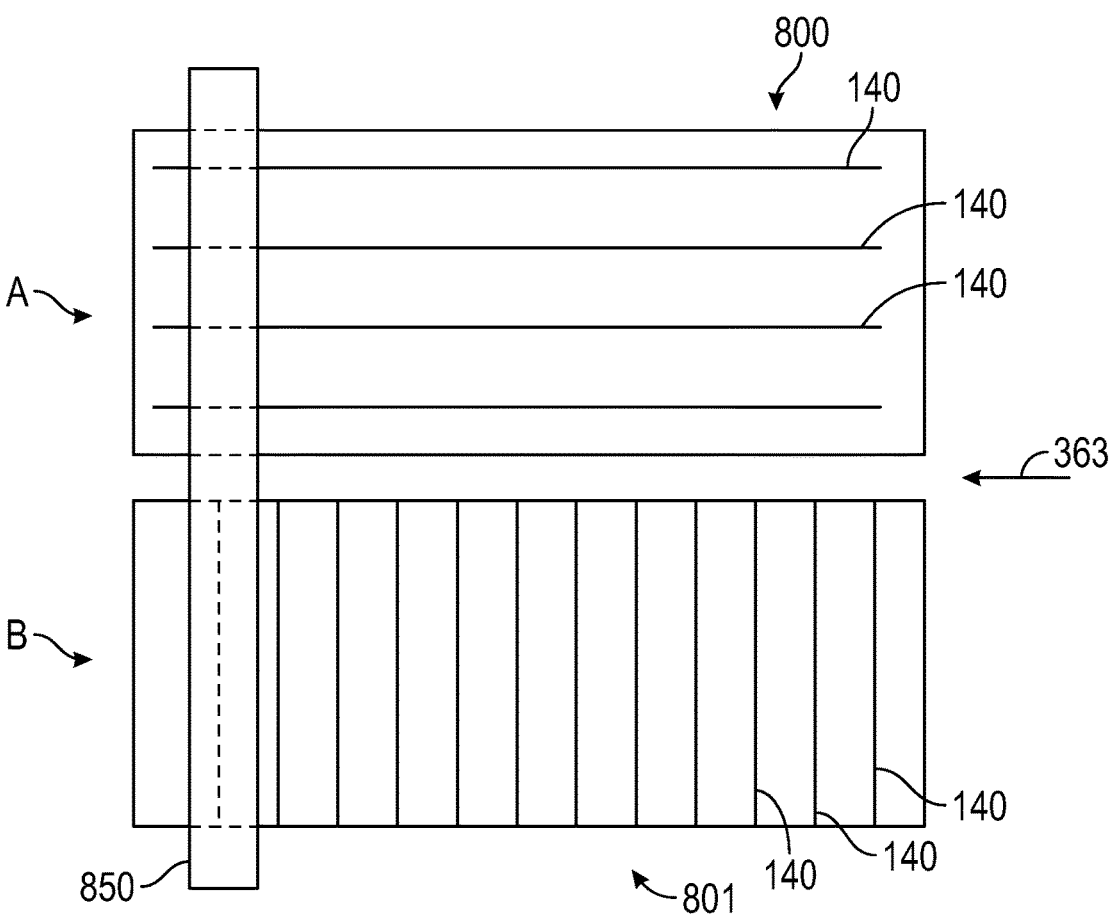
FIG. 8 illustrates a top down view of a conveyor where the pressure mechanism and the heating zone are configured such that wire may be soldered to solar cell components along the length and across the length of the wires as may be employed in embodiments.

Embodiments may comprise methods of soldering wire, such as traces or ribbon, onto single or multi-busbar solar cells. Devices constructed with such methods, such as solar cells, PV panels, and PV modules, may also be covered. Methods may include providing a wire, such as a trace or ribbon, tack soldering the wire at one or more locations to a workpiece, such as solar cell component or an array of solar cell components, and then passing the combined tacked wire and solar cell component through a heating zone where heat is applied to the backside of the solar cell component or a portion of the backside of the solar cell component such that solder in contact with the wire melts and solders the wire to the solar cell component. A heating zone in embodiments may comprise pressure mechanisms, which may contain components exerting forces that push the wire and PV component together such that soldering may be carried out. A pre-heating zone in embodiments may comprise components exerting forces that push the wire and PV component together such that heating of the components to be soldered, but no actual soldering itself, may be carried out. These heating zone and pre-heating zone pressure mechanisms may include one or more rollers or flat tips, as described below, as well as other components and/or systems. Prior to entering a heating zone or pre-heating zone, a wire may be tacked to each solar cell component of an array of solar cell components as well as to only certain solar cell components of an array of solar cell components before application of the backside heating process. As noted, a compressive force may be applied to the wire and solar cell component in the heating zone and the pre-heating zone. In some embodiments the wire may be precoated with solder prior to reaching a heating zone or pre-heating zone. In some embodiments the solder may be applied ahead of or in a heating zone or pre-heating zone. A roller or other pressure mechanism for applying compressive forces to the wire may be employed in the heating zone, in the preheating zone and/or elsewhere. This roller or other pressure mechanism may be oriented to travel along the length of the wire and apply compressive force from one end to the other of the wire. The roller or other mechanism may also be oriented to apply force to most or all of the wire at the same time. In other words, to traverse more or all of the wire's length during a soldering pass in the heating zone. FIG. 8 shows these two different orientations of travel and force. In embodiments, a roller may be positioned only on one side of the PV cell or other workpiece as well as on more than one side in embodiments. If a roller or other pressure mechanism is positioned on only one side of the PV cell an opposing force would need to be generated to oppose any forces applied by such a roller. The solar cell component may be a PV cell as well as other components that may comprise a PV panel or a PV module.

Thus, embodiments may comprise applying wire to one or more multi-bus bar PV cells or another workpiece. These PV cells may be arranged in a one-dimensional array as well as arranged in a two-dimensional array. Tack soldering wire may be a pre-step of entry into a heating zone wherein wire to be soldered to a solar cell component or other workpiece may be tack soldered to one or more locations of a single solar cell component or one or more locations of an array of solar components. Tack soldering may be performed such that the wire is less likely to move before and/or during back-side soldering steps of embodiments. Tack soldering may be located at a start, middle and/or end of a wire and not necessarily on each PV cell of an array of PV cells or other components to be soldered. Tack soldering can be performed in embodiments by induction heating, soldering only points, as well as other methods, locations, and techniques.

In embodiments a pressure mechanism such as a roller may apply a downward force on wire to be soldered and a heating zone, which may comprise a heating element, may be underneath a PV cell or other solar component such that sufficient heat to melt solder on the wire or present in the area to electrically connect the wire to the PV cell or other solar component. The heating zone created by the heating element may be small, only reaching 2-4 mm of area on the wire side surface of the solar component so that targeted heating of the solder can occur. This targeted heating zone may be larger or smaller as well. Upon completion, a wire may be fully soldered to the PV cell or other solar cell component in embodiments. This full soldering may provide both an electrical as well as a mechanical connection between the wire and the PV cell or other solar cell component.

In embodiments, heat may be placed on top of wire for tack soldering purposes, however, heating from underneath or the back-side may be the sole source of heat or the primary source of heat for back-side soldering wire. As mentioned above and described also below, a roller on top of the wire may be positioned to press the wire and to bond wire onto a PV cell in embodiments. In some instances, wire may be coated with solder coating. This coating may be used to tack soldering, back-side soldering, and both, in embodiments.

Processes of embodiments may be considered in stages where a first stage may involve tack soldering a wire to a workpiece such as a solar cell component and the second stage may involve fully soldering the wire to the solar cell component. The tack soldering here, as elsewhere, may be performed as an alignment process to hold the wire in place until the full second stage soldering can be undertaken and completed. The first stage may be completed at a time and/or location different than the second stage. The first stage may also be completed immediately prior to the second stage, for example in a pre-heating zone, as well as at a preselected time beforehand.

Embodiments preferably provide full bonding with a wire, i.e., without a gap between the soldered wire and the receiving pad or other surface. However, embodiments may be employed where gaps remain either through effort or intention. Gaps in bonding may be provided for tailored flexibility or other movement with a PV cell or between PV cells or other workpieces. Gaps in bonding may remain if insufficient heat is applied to the backside and/or if a workpiece and wire remain in a heating zone for an insufficient amount of time. In other words, an adequate amount of heat was supplied to a work piece backside but the workpiece and wire did not remain under pressure for a sufficient amount of time for solder around a wire to melt and reposition to fully secure the wire to the workpiece. Should peeling of the wire away from the heating pad or other failure occur after passing through a workpiece, additional heat and/or time in the heating zone may be need to provide for sufficient melting and adhesion between the wire and solar component.

Figure 6:
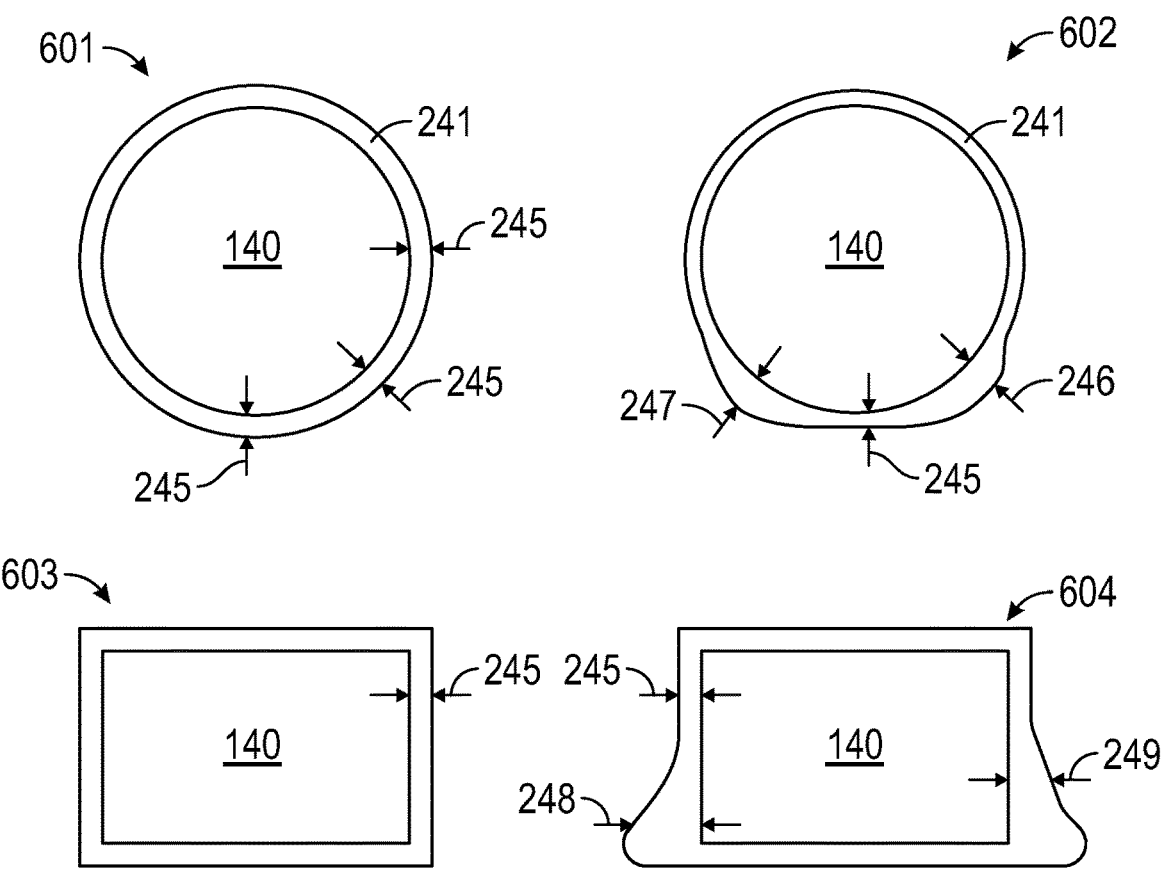
FIG. 6 illustrates a cross-sectional view of precoated wires before and after back-side soldering as may be employed in embodiments.

Melting only the bottom of the solder of a wire may occur in some embodiments. In other words, as shown in FIG. 6, the side of the wire closer to a back-side heating source may melt and deform, while the side of the wire further from the back-side heating source may remain relatively un-melted after passing through a heating zone. As noted above, a heating zone may be 2-4 mm in length. By heating such a relatively small target area only a portion of the solar cell component may receive heat sufficient to melt the heat and only a portion of the soldered covered wire may be heated to solder melting temperature. Embodiments, may, therefore, employ heat and site compression to solder a wire to a PV cell component. The heat may travel from the bottom of the workpiece to the top surface where the wire, which was initially placed/tacked, to completely bond to the PV cell or other workpiece by slight compression as the heat melts the solder and the solder bonds/cures the wire to the PV cell or other workpiece right after it leaves the heating zone.

In embodiments, the sole source of heat in the heating zone for the second stage soldering may be from beneath the wire to be soldered, for example a backside of the PV cell. This heating may be selectively applied by a heating element to only target areas sufficient to develop adequate heat at the wire solar component interface to melt solder and in so doing to solder the wire to the solar component. Heat levels close to the melting temperature of the solder (e.g., 5%-10% greater than the solder melting temperature) are preferred such that solder melting can be controlled and does not involve a large area not in contact with the solar component. For example, if a solder melting point is 200° ° C. the target heating range may be 200° C.-210° ° C. such that areas away from the target areas do not reach the melting point of the solder being employed. As noted below, the heating zone and heating element of the heating zone may be present on a conveyor system. This conveyor system can employ a belt as well as walking beam or other types of moving support.

Embodiments may or may not include the use of a carrier hold-down for the wire as the tack soldering may be enough to hold the wire in place until full soldering is completed. Flux may or may not be employed in either or both soldering stages—i.e., the tack soldering stage and the back-side soldering stage. Heat may be applied via a chuck or other pressure mechanism component underneath the solar component while an upper roller or other pressure mechanism component may be applying downward compressive force to the wire and solar component. The duration of time spent in a heating zone and the temperature of the heating zone are preferably short enough and low enough so as not to detach tack soldering before the back-side soldering can be accomplished. The duration of time may be on the order of one-half second or longer or shorter. A duration of time less than one-half second may allow for higher manufacturing throughput and may be employed when throughput increases are desired. Durations of time longer than one second may also be employed in embodiments and may be employed when thermal transfer for solder melting is slow and/or when other steps, such as additional soldering, are performed.

Heating may have various temperature and duration time ranges and various tolerances of these ranges. Temperature ranges may include 200-220 degrees Celsius as well as other temperatures suitable to melt the solder as taught herein. Time ranges may be fractions of a second to one second or more in the heating zone. The heating temperature ranges and tolerances may be set to accommodate the melting temperature and/or thermal transfer properties of the solder as well as the ambient temperature and/or the temperature of the workpiece. Heating tolerances may be on the order of one-to five degrees more or less than the target heating range. Tighter temperature tolerances of less than one degree Celsius may also be employed in embodiments.

First stage soldering may involve soldering a wire's points (start, mid & end) on 3 pads that may hold the wire in place before the final soldering. Thus, the wire may be tacked and kept in place before the next step. Second stage soldering (or final soldering) may involve soldering the whole wire present in the heating zone without necessarily detaching the tacked wire. Heat may be applied on a chuck and a wafer located in a heating zone, while the roller is pressing the wire. Short exposure on the heat should not detach the first stage soldering and may serve to solder the rest of the wire. Long exposure to heat in a heating zone may deleteriously detach the wire before or after roller passes and add complication to the process. Low temperature pre-heating may also be employed in embodiments. Tack soldering ($1^{st}$ stage) may be accomplished through pulse heat on pads while the workpiece may be held in place for second stage soldering via a vacuum force or other securing technique.

Various methods of assembling a PV (photovoltaic) cell panel may be employed in embodiments, these may comprise positioning a first PV cell component and a wire into a work area, the PV cell component having a bottom and a pad, the pad having been previously tack soldered to the wire; applying a force to push the wire and pad towards each other; and applying heat to the bottom of the PV cell component. In some embodiments, the first PV cell component may be part of a two-dimensional array of PV cells and/or the first PV cell component may be positioned into the work area atop a conveyor system. Embodiments may comprise heat being applied in a section of the conveyor system and only reaching a portion of the PV cell component and/or where a circumference of the wire is entirely coated with solder before applying heat to the bottom of the PV cell component. In some embodiments, a force may be applied along a length of the wire and/or across a length of the wire.

Various embodiments of assembling a PV (photovoltaic) cell panel may comprise tack soldering a wire to a plurality of PV cells; positioning a first PV cell of the plurality into a heating zone of the work area; applying a force to push the wire and the first PV cell of the plurality of PV cells towards each other; and applying heat to a side of the first PV cell opposite the wire, the heat having a temperature high enough to solder the wire to the first PV cell. Embodiments may comprise moving the first PV cell out of the heating zone of the work area and positioning a second PV cell of the plurality of PV cells into the heating zone of the work area. In some embodiments the first PV cell and the second PV cell may be in contact with a conveyor system when in the work area, the conveyor system may be adapted to generate the heat applied to the side of the first PV cell opposite the wire. In some embodiments a circumference of the wire may be covered in solder before the first PV cell is positioned in a heating zone of the work area and wherein the heat applied may only reach less than half of a side of the PV cell. In some embodiments, the force to push the wire and the first PV cell of the plurality of PV cells towards each other may be applied by a roller. In some embodiments, after soldering the wire to the first PV cell a cross-section of the solder around the circumference of the wire may be nonuniform.

Embodiments may also comprise methods of assembling a two-dimensional array of PV (photovoltaic) cells into a multi bus-bar PV laminate, the array of PV cells positioned on a surface of a conveyor system, each PV cell of a first row of PV cells of the two-dimensional array of PV cells being previously coupled to a wire. These methods may comprise positioning a first row of PV cells into a heating zone of a work area; applying a force to push the wire and each PV cell of the first row of PV cells towards each other; and applying heat to an underside side of each PV cell of the first row of PV cells, the heat having a temperature high enough to solder the wire to each of the PV cells in the first row of PV cells. In some embodiments, methods may comprise moving the first row PV cells out of the heating zone of the work area and positioning a second row of PV cells of the two-dimensional array of PV cells into the heating zone of the work area. In some embodiments, a conveyor system may be adapted to generate the heat applied to the underside of the first row of PV cells. In some embodiments, a circumference of the wire may be covered in solder before the first row of PV cells is positioned in the work area. In some embodiments, a force to push the wire and each PV cell of the first row of PV cells towards each other may be applied by a roller. In some embodiments, after soldering the wire to each PV cell of the first row of PV cells a cross-section of the solder around the circumference of the wire may be nonuniform. In some embodiments, a conveyor system may have a pressure mechanism including a heating element opposite a roller that is applying the force to push a wire and each PV cell of a first row of PV cells towards each other.

FIG. 1 illustrates a top down view of a multi-busbar (MBB) solar cell, an enlarged portion of the MBB solar cell with highlighted tack soldering and back-side soldering, and a PV panel having a plurality of these MBB solar cells. The multi-bus bar solar cell 100 is shown with a plurality of wires 140. These wires can transport and communicate the electrical power within and to outside of the solar cell 100. During assembly a first stage 120 tack soldering may be completed to hold the wire 140 down until the second stage 130 soldering (back-side soldering), which more completely solders the wire to the underlying silver material, can be completed. As can be seen in FIG. 1, the first stage tack soldering 120 may be at intervals along the wire 140 and the second stage soldering 130 (back-side soldering) may be along the entire length or the majority of the length of the wire 140. PV panel 110 shows how multiple solar cells 100 may be positioned in a two-dimensional array type orientation when installed on a PV panel. The numbers of rows and columns of solar cells 100 can vary on different PV panels 110 of embodiments.

Figure 2:
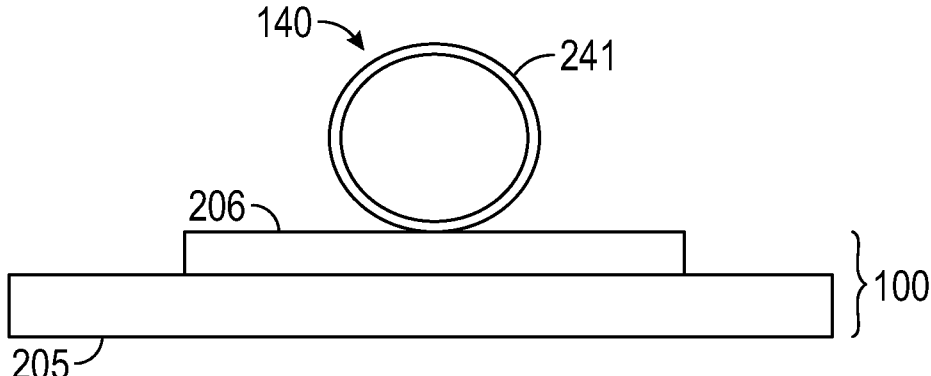
FIG. 2 illustrates a cross-section of a solar cell component with a pad of printed silver etching and a soldered coated wire as may be employed in embodiments.

FIG. 2 illustrates a cross-section of a solar cell component with a pad of printed silver etching 206 and a solder coating 241 of the wire 140 as may be employed in embodiments. The solar cell 100 is shown as having at least two layers. A wafer layer 205 below a pad of printed Ag etching 206. The printed pad of silver etching 206 is shown to be in contact with the solder coating 241 of the wire 140. This solder coating may be melted via back-side heating applied below the solar cell component such that a portion of the solder coating 241 around the wire 140 and in contact with the pad of printed silver etching 206 melts and resolidifies such that a soldered electrical and mechanical connection may be created between the wire 140 and the pad of printed silver etching 206.

Figure 3:
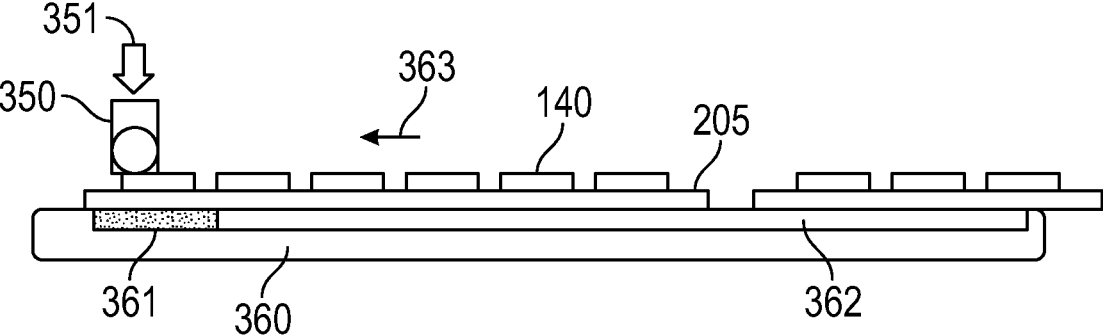
FIG. 3 illustrates a side view of a vacuum belt conveyor with a pressure mechanism for applying a compressive force and a heating zone (e.g., a heated portion of the conveyor) as may be employed to solder wires onto solar cell components as may be employed in embodiments.

FIG. 3 illustrates a side view of a vacuum belt conveyor 360 with a pressure mechanism 350 and a heating zone 361 as may be employed to solder wires 140 onto solar cell components as may be employed in embodiments. The vacuum belt conveyor 360 has a heating zone 361 that sits at the side of the wafer 205, which is a solar cell component, opposite the side of the wafer 205 that will be soldered to the wire 140, i.e., the back-side. The conveyor 360 moves the wire and wafer 205 in the direction of arrow 363. The conveyor 360 may be operated at constant speeds, variable speeds, and combinations thereof. The heating elements of the heating zone 361 may be operated at different temperatures that may be in a range of 200-220 degrees Celsius as well as in other temperature ranges. As also mentioned above, the temperature tolerance may be one degree Celsius as well as more or less. A compressive force 351 from a pressure mechanism 350 may be applied to the wire 140 in the heating zone 361. This force 351 may serve to maintain the position between the wire 140 and the solar cell component wafer 205 as the solder is melted and then resolidified. The speed of the conveyor 360 and the temperature of the heating zone may be adjusted such that only a portion of the solder coating of the wire 140 melts and such that the tack soldering is sufficient to have the wire 140 and wafer 205 remain in a proper positioning after the second stage soldering is complete. FIG. 3 also has an upstream portion of the conveyor labelled at 362. This upstream portion 362 may provide a pre-heat or may provide no heat at all. A pre-heat applied may be set to raise the temperature of the wire and/or solder for improved or quicker stage two soldering in the heating zone 361 but limit or provide no damage to stage one soldering being preheated.

Figure 4:
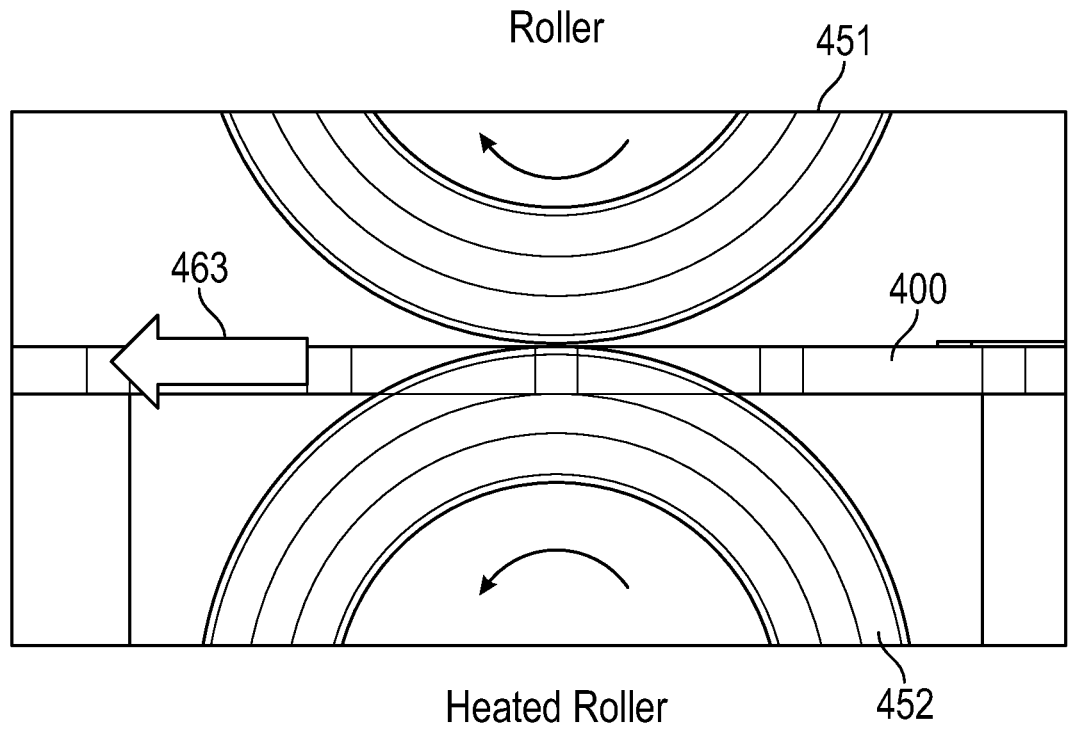
FIG. 4 illustrates a close-up sectional view of a pressure mechanism employing upper and lower rollers, with a heated lower roller, as may be employed in embodiments.

FIG. 4 illustrates a close-up sectional view of a pressure mechanism, which may be present in a heating zone, employing upper and lower rollers, with a heated lower roller, as may be employed in embodiments. Labelled in FIG. 4 are a front-side roller 451, a back-side roller 452, which is also heated, a direction of travel 463, and a solar cell component 400. The solar cell component 400 is shown being fed from right to left in FIG. 4 and the heated back-side roller 452 may be generating enough heat such that a wire positioned on the front side of the solar cell component 400 may be soldered to the solar component 400 as the component 400 passes the back-side roller 452.

Figure 5:
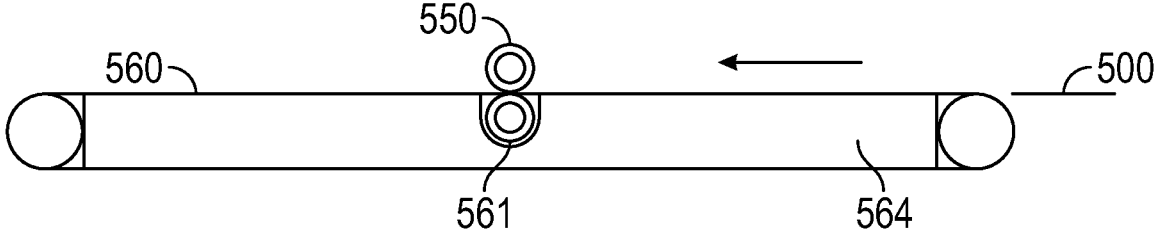
FIG. 5 illustrates a side view of a vacuum belt conveyor with vacuum manifold, upper pressure mechanisms (e.g., multiple round rollers or multiple flat tips), lower pressure mechanisms (e.g., multiple heated rollers or multiple flat tips), and solar cell components with a tacked wire as may be employed in embodiments.

FIG. 5 illustrates a side view of a vacuum belt conveyor 560 with vacuum manifold 564, multiple round roller or pressure tip upper pressure mechanism 550, multiple heated roller or pressure tip lower pressure mechanism 561, and solar cell component with tacked wire 500 as may be employed in embodiments. In FIG. 5, which is similarly shown in a perspective view in FIG. 7, multiple vacuum belts are used to hold and move the wire and solar cells for second stage soldering. The second stage soldering is carried out via the multiple rollers or pressure tips of the upper pressure mechanism 550 pressing downwardly against the multiple heated part 561 of the vacuum belt conveyor 560.

FIG. 6 illustrates cross-sectional views of precoated wires 140 before (601 and 603) and after (602 and 604) back-side soldering as may be employed in embodiments. The solder thickness 245 is shown to be somewhat uniform in 601 and 603 while the solder thickness 241, 246, 247, 248 and 249 is shown to vary in 602 and 604. As can be seen in FIG. 6, solder material may be repositioned after soldering and may have varying thicknesses and may also somewhat mimic a surface of the solar component the wire is begin soldered to. As can be seen in 602 and 604 a somewhat flat section may be present after soldering reflecting that the solder has melted and then become bound to a flatter solar cell component surface below the wire 140 during and/or after second stage soldering is completed.

Figure 7:
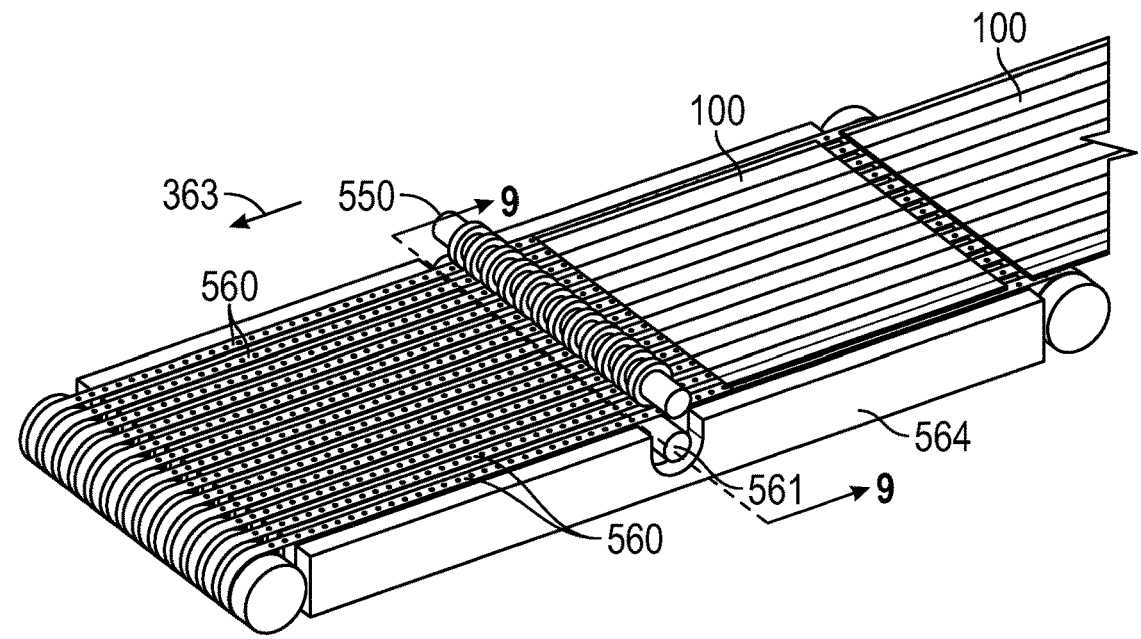
FIG. 7 illustrates a perspective view of a vacuum belt conveyor with vacuum manifold, upper pressure mechanisms (e.g., multiple round rollers or multiple flat tips) lower pressure mechanisms (e.g., multiple heated rollers or multiple flat tips), and solar cell components with tacked wires as may be employed in embodiments.

FIG. 7 illustrates a perspective view of a vacuum belt conveyor with vacuum manifold 564, multiple round roller or flat tip upper pressure mechanism 550, multiple heated roller or flat tip lower pressure mechanism 561, and solar cell component 100 with tacked wire as may be employed in embodiments. The multiple small vacuum belts 560 are more evident in FIG. 7 and show how these multiple belts 560 may be employed to hold and position the solar components 100 before, during, and after passing between the upper pressure mechanism 550 and the lower pressure mechanism 561. As the solar component 100 passes though 550 and 561 the second stage soldering may occur. The lower pressure mechanism 561 may be a source of heat and may comprise a heating zone. As noted above the amount of heat and the time taken to pass through the heating zone may be varied and may be selected to accommodate the type of solder, the pressure applied, the ambient surrounding conditions, the wire composition and other variable as well.

FIG. 8 illustrates a top down view of a conveyor where the mechanism for applying compressive force and the heating zone 850 are configured such that wire 140 may be soldered to solar cell components along the length as in first solar component 800 and across the length of the wires as in second solar component 801. In other words, the compressive force and heat may be applied to a wire/solar component in various orientations. This may include orienting the wires 140 as in A such that the heat and compressive force are applied along the length of the wires 140 and orienting the wires 140 as in B such that the heat and compressive force are applied across the length of the wires 140. Compressive forces may be applied in a perpendicular as well as non-perpendicular orientations. The forces may be within various scalar ranges and may be steady state as well as well as variable. The variable forces may start at zero newtons or near zero newtons and may increase to half-a newton or more. A steady state force may be tenths of a Newton to half of a Newton to one or more Newtons. These forces may be applied for various periods of time including milliseconds, tenths of seconds, and one second or more.

Figure 9:
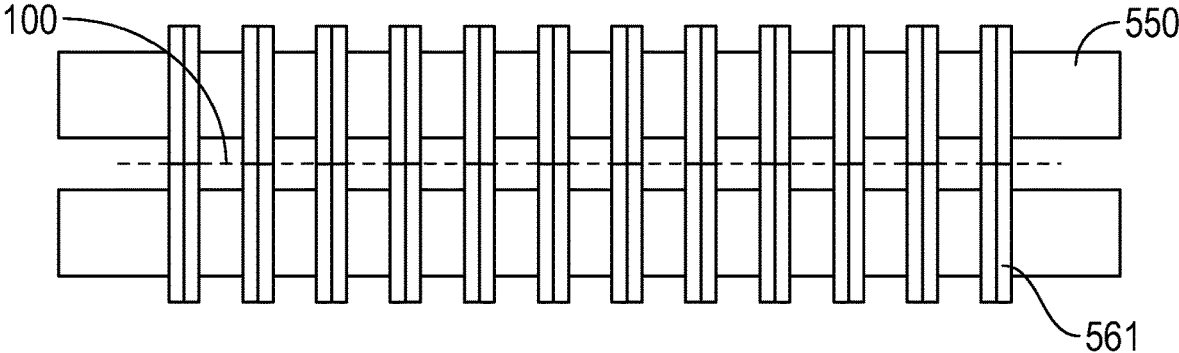
FIG. 9 shows a partial sectional view along line 9-9 of FIG. 7.

FIG. 9 shows a partial sectional view along line 9-9 of FIG. 7. The conveyor and vacuum manifold are not shown in this sectional view. The solar cell component 100 can be seen positioned between multiple round roller or flat tip upper pressure mechanism 550 and multiple heated roller or flat tip lower pressure mechanism 561. The alignment between the upper and lower mechanisms can be seen along with the positioning and contact with the solar component 100 as may be employed in embodiments. The individual rollers of the upper mechanism 550 and the lower mechanism 551 may each independently move up and down to accommodate differences in thickness of solar cell components 100 and variations thereof. The rollers are shown in contact with each other in FIG. 9 but gaps may exist in embodiments to accommodate different thicknesses of solar cell components passing therebetween.

Figure 10:
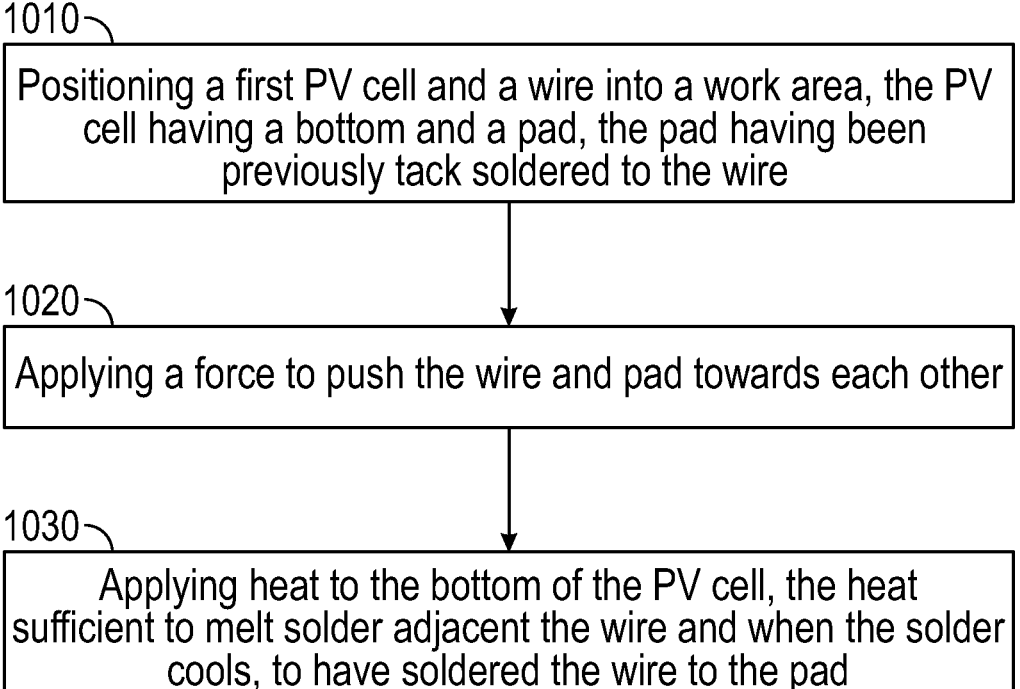
FIG. 10 shows a method of assembling a PV cell as may be employed in embodiments.

FIG. 10 shows a method of assembling a PV cell component as may be employed in embodiments. Number 1010 describes how embodiments may comprise positioning a first PV cell and a wire into a work area, such as a heating zone. Here, the PV cell component may have a bottom and a pad, the wire having been previously tack soldered to the pad. Number 1020 describes how embodiments may comprise applying a force to push the wire and pad towards each other. This force may be applied by a pressure mechanism, such as one or two opposing rollers, one or two opposing pressure tips, and various other opposing components capable of exerting opposing forces. Number 1030 of FIG. 10 describes how heat may be applied to the bottom of the PV cell and this heat may be sufficient to melt solder adjacent the wire and when the solder cools, to have soldered the wire to the pad.

FIG. 11 shows a method of assembling a two-dimensional array of PV (photovoltaic) cells as may be employed in embodiments. Number 1100 describes how embodiments may include assembling a two-dimensional array of PV (photovoltaic) cells into a multi bus-bar PV laminate. Here, an array of PV cells may be positioned on a surface of a conveyor system where each PV cell of a first row of PV cells of the two-dimensional array of PV cells may have been previously coupled to a wire. Number 1110 describes how embodiments may comprise positioning a first row of PV cells into a work area while number 1120 describes that a force may be applied to push the wire and each PV cell of the first row of PV cells towards each other in embodiments. Number 1130 describes that, in embodiments, heat may be applied to an underside side of each PV cell of a first row of PV cells, where the heat may have a temperature high enough to solder the wire to each of the PV cells in the first row of PV cells.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of assembling a two-dimensional array of PV (photovoltaic) cells into a multi bus-bar PV laminate, the array of PV cells positioned on a surface of a conveyor system, each PV cell of a first row of PV cells of the two-dimensional array of PV cells being previously coupled to a wire, the method comprising:

positioning the first row of PV cells into a work area;

applying a force to push the wire and each PV cell of the first row of PV cells towards each other; and applying heat to an underside side of each PV cell of the first row of PV cells, the heat having a temperature high enough to solder the wire to each of the PV cells in the first row of PV cells.

2. The method of claim 1 further comprising:

moving the first row PV cells out of the work area and positioning a second row of PV cells of the two-dimensional array of PV cells into the work area.

3. The method of claim 1 wherein the conveyor system is adapted to generate the heat applied to the underside of the first row of PV cells.

4. The method of claim 1 wherein a circumference of the wire is covered in solder before the first row of PV cells is positioned in the work area.

5. The method of claim 1 wherein the force to push the wire and each PV cell of the first row of PV cells towards each other is applied by a roller.

6. The method of claim 1 wherein after soldering the wire to each PV cell of the first row of PV cells a cross-section of the solder around the circumference of the wire is nonuniform.

7. The method of claim 1 wherein the conveyor system has a heating element opposite a roller that is applying the force to push the wire and each PV cell of the first row of PV cells towards each other.

\* \* \* \* \*